United States Patent [19]

Kreuz

[11] Patent Number: 5,219,977
[45] Date of Patent: Jun. 15, 1993

[54] TETRAPOLYIMIDE FILM CONTAINING OXYDIPTHALIC DIANHYDRIDE

[75] Inventor: John A. Kreuz, Columbus, Ohio

[73] Assignee: E. I. Du Pont de Nemours and Company, Wilmington, Del.

[21] Appl. No.: 920,690

[22] Filed: Jul. 30, 1992

Related U.S. Application Data

[63] Continuation of Ser. No. 628,233, Dec. 17, 1990, abandoned.

[51] Int. Cl.$^5$ .................. C08G 73/10; C08G 69/26
[52] U.S. Cl. .................. 528/125; 428/473.5;
528/126; 528/128; 528/170; 528/172; 528/173;
528/176; 528/179; 528/220; 528/229; 528/350;
528/353
[58] Field of Search ............. 528/125, 126, 128, 170,
528/172, 173, 176, 179, 220, 229, 350, 353;
428/473.5

[56] References Cited

U.S. PATENT DOCUMENTS

| | | | |
|---|---|---|---|
| 4,535,105 | 8/1985 | Inaike et al. | 524/104 |
| 4,590,258 | 5/1986 | Linde et al. | 528/189 |
| 4,677,186 | 6/1987 | Pfeifer | 528/220 |
| 4,778,872 | 10/1988 | Sasaki et al. | 528/176 |
| 4,855,391 | 8/1989 | Berdahl et al. | 528/188 |
| 4,892,896 | 1/1990 | Wright | 523/300 |
| 4,914,182 | 4/1990 | Pfeifer et al. | 528/353 |
| 5,004,627 | 4/1991 | Presswood et al. | 528/353 |

FOREIGN PATENT DOCUMENTS

0396528 7/1990 European Pat. Off. .
9002767 1/1988 World Int. Prop. O. .

*Primary Examiner*—John Kight, III
*Assistant Examiner*—Shelley A. Dodson

[57] ABSTRACT

Tetrapolyimide films derived from oxydiphthalic dianhydride, pyromellitic acid dianhydride, p-phenylene diamine and 4,4'-diaminodiphenyl ether, and their preparation are described. The tetrapolymer films have low water absorption, low coefficients of thermal and hygroscopic expansion, high modulus and are caustic etchable and can be used in flexible printed circuit and tape automated bonding applications.

12 Claims, No Drawings

TETRAPOLYIMIDE FILM CONTAINING OXYDIPTHALIC DIANHYDRIDE

This is a continuation of application Ser. No. 07/628,233 filed Dec. 17, 1990, now abandoned.

BACKGROUND OF THE INVENTION

This invention relates to a tetrapolyimide film having low water absorption, low coefficients of hygroscopic and thermal expansion, high modulus, and which is caustic etchable, for use as a tape automated bonding (TAB) substrate.

TAB is an electronic chip packaging technology which uses an etched, fine-line conductor pattern in a flexible carrier tape form.

The common construction of the tape carrier/interconnect product is virtually identical to flexible circuitry, except for two special features. An opening, appropriately called a window, is formed near the center of the conductor array in the dielectric base film. The window permits the etched conductor leads to extend over the opening, creating the essential beam type interconnect array.

The other characteristic of TAB is the precision sprocket holes located on the edge of the tape. TAB tape is provided in reel form, looking much like movie film and is available in widths from 8 to 70 mm.

The integrated circuit (IC) connection to TAB is accomplished by placing the chip in the window area beneath the unsupported connectors, or "fingers", aligning the leads with the metal-coated bonding pads on the chip, and then gang bonding the entire array by thermal compression. A raised metal area, called a "bump", must be incorporated into the IC pads or into the TAB leads to make the bonding process workable. This gang bonding technique, called inner lead bonding (ILB), provides two important features, viz. assembly speed and connection to higher density chips. The bonded IC is usually protected by applying organic potting compound onto the chip for protection in a process called "globbing" or "encapsulation". The loaded tape is then assembled to the printed circuit.

The subsequent TAB-to-circuit bonding step, called outer lead bonding (OLB) requires that the TAB interconnect area be etched from the tape. The etched TAB component is bonded to the surface of the printed circuit by aligning the TAB outer lead frame to corresponding bond sites on the circuit and then applying bonding energy by thermal compression or reflow soldering. The resulting assembly occupies a smaller space, has a very low profile and has superior electrical characteristics compared to its popular wire-bonded counterpart.

Three-layer TAB tapes are the most widely used today. This type of tape consists of copper foil which is often 1.4 mils thick and is bonded to a polyimide film with a layer of polyester, acrylic, or epoxy based adhesive. Normally, the polyimide film is coated on one side with adhesive and slit to the correct width. The windows and sprocket holes are punched or chemically etched out and the tape is then laminated to the copper foil. The foil is then selectively etched into the radiating patterns that form the IC interconnects.

Two-layer TAB tapes are becoming more functionally useful and consist of copper bonded directly to polyimide, without a layer of polyester, acrylic, or epoxy based adhesive. Most often, the copper is applied to the polyimide by sputtering or electroless plating and built to a thick, 1.4 mil layer of copper by electroplating. Sprocket holes can be punched, but windows are etched in the polyimide.

The polyimide used as the base film in TAB tapes must have a relatively small thermal expansion coefficient which is close to the thermal expansion coefficient of the metallic film, otherwise curling of the composite tape occurs during exposure to high temperatures during processing. The film must have good flexibility to avoid cracking on TAB equipment and high modulus so that sprocket holes do not distort during movement of the tape.

The film must also have a low coefficient of hygroscopic expansion so that dimensions stay more constant with humidity changes, thereby making humidity control less important in processing and causing less stress to build up in humidity cycling to prevent cracking. Finally, film etchability allows chemical etching of holes in the dielectric rather than punching them or using laser cutting.

U.S. Pat. No. 4,778,872, issued to Sasaki et al. on Oct. 18, 1988, discloses a copolyimide film containing from 15 to 85 mole % of a biphenyltetracarboxylic acid dianhydride, 15 to 85 mole % of pyromellitic acid dianhydride, 30 to 100 mole % of p-phenylene diamine and 0 to 70 mole % of a diaminodiphenyl ether. Up to 5 mole % of the tetracarboxylic acid dianhydrides can be substituted by other dianhydrides such as oxydiphthalic dianhydride to provide pentapolyimide films. The invention film compositions are tetrapolyimides not pentapolyimides and do not contain biphenyltetracarboxylic acid dianhydride.

U.S. Pat. No. 4,535,105, issued to Inaike et al. on Aug. 13, 1985, discloses a copolyamic acid solution for preparing a copolyimide insulating varnish containing at least 80 mole % of a tetracarboxylic acid component consisting of a 30:70 to 75:25 mole ratio of biphenyltetracarboxylic acid dianhydride and pyromellitic acid dianhydride and less than 20 mole % of a diamine component consisting of at least 70 mole % of 4,4'-diaminodiphenyl ether and 30 mole % or less of p-phenylene diamine. The tetracarboxylic acid component can additionally contain 20 mole % or less of an acid ingredient such as oxydiphthalic dianhydride. The invention compositions are tetrapolyimides not pentapolyimides and do not contain biphenyltetracarboxylic acid dianhydride.

U.S. Pat. No. 4,855,391, issued to Berdahl et al. on Aug. 8, 1989, discloses a high temperature stable copolyetherimide film derived from oxydiphthalic dianhydride, p-phenylene diamine and 4,4'-diaminodiphenyl ether. The prior art patent does not disclose a tetrapolyimide film containing pyromellitic acid dianhydride.

Coassigned U.S. patent application Ser. No. 07/516,887, filed on Apr. 30, 1990, discloses a tetrapolyimide film comprising a tetracarboxylic acid component containing from 10 to 90 mole % of biphenyltetracarboxylic acid dianhydride, 90 to 10 mole % of pyromellitic acid dianhydride and a diamine component containing from 10 to 90 mole % of p-phenylene diamine and 90 to 10 mole % of a diaminodiphenyl ether. The invention tetrapolyimide films contain oxydiphthalic dianhydride as a component not biphenyltetracarboxylic acid dianhydride.

The present invention provides a tetrapolyimide film, and a process for its preparation, comprising oxydiphthalic dianhydride, pyromellitic acid dianhydride, p-phenylene diamine and diaminodiphenyl ether having the unique property advantages of high modulus, low coefficients of thermal and hygroscopic expansion, low water absorption and caustic etchability for use in flexible printed circuits and tape automated bonding applications.

SUMMARY OF THE INVENTION

The present invention relates to a tetrapolyimide film for use in flexible printed circuits and TAB applications, comprising on the basis of dianhydride from 20 to 70 mole % of oxydiphthalic dianhydride and from 30 to 80 mole % of pyromellitic acid dianhydride and on the basis of diamine from 30 to 80 mole % of p-phenylene diamine and from 20 to 70 mole % of 4,4'-diaminodiphenylether.

The invention further relates to a chemical conversion process for preparing a tetrapolyimide film having a high modulus, low coefficients of thermal and hygroscopic expansion, low water absorption and enhanced caustic etchability, comprising the steps of:

(a) reacting substantially equimolar amounts based on total dianhydride and total diamine of oxydiphthalic dianhydride, pyromellitic acid dianhydride, p-phenylenediamine, and 4,4'-diaminodiphenyl ether in an inert organic solvent for a sufficient time and at a temperature below 175° C. sufficient to form a tetrapolyamide acid solution in said solvent;

(b) mixing said tetrapolyamide acid solution with conversion chemicals capable of converting the tetrapolyamide acid to tetrapolyimide;

(c) casting or extruding the mixture from step (b) onto a smooth surface to form a tetrapolyamide acid-tetrapolyimide gel film; or alternatively in place of steps (b) and (c) a single step of casting or extruding said tetrapolyamide acid solution into a mixture or solution of conversion chemicals capable of converting the tetrapolyamide acid to tetrapolyamide acid-tetrapolyimide gel film; and (d) heating said gel film from step (c) at a temperature and for a time sufficient to convert said tetrapolyamide acid to tetrapolyimide.

More specifically, the chemical conversion process for preparing the tetrapolyimide film of the present invention comprises copolymerizing from 20 to 70 mole %, preferably 30 to 70 mole %, of oxydiphthalic dianhydride; 30 to 80 mole %, preferably 30 to 70 mole %, pyromellitic acid dianhydride; 30 to 80 mole %, preferably 50 to 80 mole %, p-phenylene diamine; and 20 to 70 mole %, preferably 20 to 50 mole %, 4,4'-diaminodiphenylether.

DETAILED DESCRIPTION OF THE INVENTION

The invention relates to tetrapolyamic acids and tetrapolyimides containing two tetracarboxylic acid dianhydrides and two diamines and wherein one of the dianhydrides is oxydiphthalic dianhydride (ODPA). The tetrapolymers may be either block or random.

The two diamines used herein are an inflexible diamine such as p-phenylene diamine and a flexible diamine such as 4,4'-diaminodiphenyl ether (ODA). Typically, the tetrapolyimide contains from about 30 to 80 mole %, preferably from 50 to 80 mole %, and most preferably from 60 to 80 mole % of PPD based on the total molar amount of diamine.

The two dianhydrides used herein are an inflexible dianhydride such as pyromellitic dianhydride (PMDA) and a flexible dianhydride such as oxydiphthalic dianhydride (ODPA). Typically, the tetrapolyimide contains from about 20 to 70 mole %, preferably from 30 to 70 mole %, and most preferably from 40 to 60 mole % of ODPA based on the total molar amount of dianhydride.

By careful adjustment of the mole ratio of ODPA in the dianhydride portion of the tetrapolyimide and of PPD in the diamine portion of the tetrapolyimide, a tetrapolyimide film can be obtained having unique property advantages such as high modulus, low coefficients of thermal and hygroscopic expansion and low moisture absorption. Moreover, tetrapolyimide films containing ODPA as a component are more flexible and easily fabricated during processing than tetrapolyimide films not containing ODPA, thereby insuring that the films can be fully cured without breaking.

If the amount of ODPA used is too low at a given PPD molar ratio, the resultant tetrapolyimide film has increased hygroscopic expansion coefficient and increased water absorption. If the amount of ODPA used is too high at a given PPD molar ratio, then the resultant tetrapolyimide film will etch poorly and it will be too soft at high temperatures of circuitry fabrication.

The aromatic tetrapolyamide acid is prepared by block or random copolymerization of substantially equimolar amounts of the aforesaid tetracarboxylic acid and diamine components at a polymerization temperature not higher than 175° C., preferably not higher than 90° C. for about one minute to several days in an inert organic solvent. The tetracarboxylic acid and diamine components can be added either neat, as a mixture or as solutions to the organic solvent or the organic solvent may be added to the components. The organic solvent may dissolve one or all of the polymerizing components and, preferably, will dissolve the tetrapolyamide acid polymerization product. The solvent must, of course, be substantially unreactive with all of the polymerizing components and with the tetrapolyamide acid polymerization product.

Preferred solvents include normally liquid N,N-dialkylcarboxylamides, generally. Preferred solvents include the lower molecular weight members of such carboxylamides, particularly N,N-dimethylformamide and N,N-dimethylacetamide. Other useful compounds of this class of solvents are N,N-diethylformamide and N,N-diethylactamide. Other solvents which may be used are dimethylsulfoxide, N-methyl-2-pyrrolidone, N-cyclohexyl-2-pyrrolidone, tetramethyl urea, dimethyl-sulfone, hexamethylphosphoramide, tetramethylenesulfone, diglyme, pyridine and the like. The solvents can be used alone, in combinations with one another or in combinations with poor solvents such as benzene, benzonitrile, dioxane, etc. The amount of solvent used preferably ranges from 75 to 90 weight % of the tetrapolyamide acid solution, since this concentration has been found to give optimum molecular weight.

It is not required that the tetracarboxylic acid and diamine components be used in absolutely equimolar amounts. In order to adjust the molecular weight, the molar ratio of tetracarboxylic acid components to aromatic diamine components can range from 0.90 to 1.10.

The aromatic tetrapolyamide acid solution prepared as described above contains from 5 to 40 weight %, preferably 10 to 25 weight %, of tetrapolyamide acid polymer.

The tetrapolyamide acid can be converted to tetrapolyimide by either a thermal or a chemical conversion process. However, chemical conversion is preferred to obtain property advantages such as lower coefficients of hygroscopic absorption, lower water absorption, higher crystallinity and enhanced caustic etchability making the tetrapolyimide films useful in flexible printed circuit and TAB applications.

According to the chemical conversion process, the tetrapolyamide acid solution is either immersed in or mixed with conversion chemicals. The polyamide acid conversion chemicals are tertiary amine catalysts and anhydride dehydrating materials. The preferred anhydride dehydrating material is acetic anhydride and is often used in slight molar excess of the amount of amide acid groups in the tetrapolyamide acid, typically about 2-2.4 moles per equivalent of tetrapolyamide acid. A comparable amount of tertiary amine catalyst is often used.

Besides acetic anhydride, other operable lower fatty acid anhydrides include propionic, butyric, valeric, mixed anhydrides of these with one another and with anhydrides of aromatic monocarboxylic acids, for example, benzoic acid, naphthoic acid, and the like, and with anhydrides of carbonic and formic acids, as well as aliphatic ketenes (ketene and dimethyl ketene). Ketenes may be regarded as anhydrides of carboxylic acids derived from drastic dehydration of the acids.

The preferred tertiary amine catalysts are pyridine and beta-picoline and they are used in varying amounts from zero to several moles per mole of anhydride dehydrating material. Tertiary amines having approximately the same activity as the preferred pyridine and beta-picoline may also be used. These include alpha picoline; 3,4-lutidine; 3,5-lutidine; 4-methyl pyridine; 4-isopropyl pyridine; N,N-dimethylbenzyl amine; isoquinoline; 4-benzyl pyridine, N,N-dimethyldodecyl amine and triethyl amine. Trimethyl amine is more active than those amines listed above and can be used in smaller amounts.

The polyamide acid conversion chemicals react at about room temperature or above to convert tetrapolyamide acid to tetrapolyimide. The chemical conversion reaction preferably occurs at temperatures from 15 to 120° C., with the reaction being very rapid at the higher temperatures and very slow at the lower temperatures.

The chemically treated tetrapolyamide acid solution is cast or extruded onto a heated conversion surface whereupon some of the solvent is evaporated from the solution, the tetrapolyamide acid is partially chemically converted to tetrapolyimide, and the solution takes the form of a tetrapolyamide acid-tetrapolyimide gel. Alternately, the tetrapolyamide acid solution can be extruded into a bath of conversion chemicals consisting of an anhydride component and a tertiary amine component with or without a diluting solvent. Conversion of amide acid groups to imide groups depends on contact time and temperature but is usually about 25 to 75% complete. The gel is self-supporting in spite of its high solvent content.

The gel may be additionally treated by extraction, coating, or some other means. It is then subsequently dried to remove the water, residual solvent, and remaining conversion chemicals, and the tetrapolyamide acid is completely converted to tetrapolyimide. The drying can be conducted at relatively mild conditions without complete conversion of tetrapolyamide acid to tetrapolyimide at that time, or the drying and conversion can be conducted at the same time using higher temperatures. Because the gel has so much liquid which must be removed during the drying and converting steps, the gel must be restrained during drying to avoid undesired shrinkage. In continuous production, the film can be held at the edges, such as in a tenter frame using tenter clips or pins for restraint.

Preferably, high temperatures are used for short times to dry the film and convert it to tetrapolyimide in the same step. It is preferred to heat the film to a temperature of 200-550° C. for at least one second. Of course, less heat and time are required for thin films than for thicker films. During this drying and converting, the film is restrained from undue shrinking and, in fact, can be stretched by as much as 200 percent of its initial dimension prior to completion of the drying and conversion. Stretching can be in any dimension. In film manufacture, stretching can be in either the longitudinal direction, the transverse direction or both directions. If desired, restraint can also be provided to permit some limited degree of shrinkage.

The caustic etching rate of the chemically converted films, within the compositional scope of this invention, is much greater than the corresponding caustic etching rate of thermally converted films. Etch rate was determined by measuring the film thickness and then contacting one surface of the film with caustic etchant consisting of 2N KOH in 80:20 (by volume) ethanol:water at 40° C. for 20 minutes as described in U.S. Pat. No. 4,426,253. Afterwards the film surface was rinsed with deionized water at a rate of 100 ml/minute for five minutes, and then the film was dried and remeasured for thickness. The loss in film thickness in mils/hour/side was calculated.

Temperature of the final cure can also affect etch rates despite the method of conversion used. With chemical conversion, however, it is possible to meet and exceed 400° C. cure without decreasing etch rates as much as would be observed if the films were thermally cured at equivalent temperatures.

The tetrapolyimide film prepared by chemical conversion as herein described has a unique combination of properties such as a high modulus of elasticity of about 400 to 1000 Kpsi, a low coefficient of thermal expansion of about 8 to 35 ppm/° C., a low coefficient of hygroscopic expansion of about 10 to 30 ppm/%RH, a water absorption of less than 4%, and excellent caustic etchability.

It is believed that these properties are enhanced due to the greater planarity and crystallinity of the tetrapolyimide film obtained by chemical conversion as compared to thermal conversion. Accordingly, the tetrapolyimide film can be advantageously used as a base film for a flexible printed circuit board and, particularly, for tape automated bonding.

The advantageous properties of this invention can be observed by reference to the following examples which illustrate, but do not limit, the invention. All parts and percentages are by weight unless otherwise indicated.

EXAMPLES 1 to 11

These examples illustrate the preparation of tetrapolyimide films of the invention having different ranges of monomer components prepared by a chemical conversion process.

All tetrapolyamic acids and the control polyamic acid were made at 15% solids. They were prepared by dissolving the two diamines in dimethylacetamide (DMAC) solvent, adding the ODPA and finally adding the PMDA at a temperature of 23° C. with stirring. The diamine components totaled 100 mmoles, and the total dianhydride components were present in approximately equivalent amounts to the diamines. Six percent solutions of PMDA in DMAC were added to provide tetrapolyamic acid solutions having the final rotational and dilute solution viscosities specified in Table I.

The tetrapolyamic acids were chemically converted into tetrapolyimide films by casting the tetrapolyamic acid solutions onto glass plates and then immersing the cast films in a 50:50 by volume mixture of acetic anhydride and beta-picoline until the gelled films floated free from the glass (ca. 5 minutes). The gel films were pinned on frames and cured at 300° C. for 1 hour and then at 400° C. for 5 minutes.

Water absorptions were determined by placing strips of film in a 100% relative humidity chamber for 48 hours at room temperature. The film samples were subsequently analyzed for water content by thermal gravimetric analysis at 10° C./minute between a temperature range of 35° to 250° C.

Thermal expansion coefficients (CTE) were measured by placing strips of film (6 mm wide×30 mm long) on quartz hooks in a Mettler thermal mechanical apparatus. A constant force of 0.005 Newton was imposed on the sample and the temperature was raised to 350° C. under nitrogen at a rate of 10° C./minute. The sample was allowed to cool while relaxed and the same heating conditions were applied again. The CTE was measured between 40° and 250° C.

The tensile modulus was measured using a Standard Instron testing apparatus and the values are the average of three runs.

In order to compare the etch rates of chemically converted tetrapolyimide films with the corresponding thermally converted films, samples of the tetrapolyamic acid solutions were also thermally converted to tetrapolyimides by casting and drying the tetrapolyamic acids at 70° C. and then curing at 300° C. for 1 hour and then at 400° C. for 5 minutes.

The etch rates were determined by the method described in U.S. Pat. No. 4,426,253, using an etching solution of 2NKOH in 80:20 by volume ethanol:water and immersing the tetrapolyimide film samples at 40° C. for 20 minutes. Etching was performed in a Lucite cell so that only one side of the film was etched. The etched film samples were subsequently rinsed in distilled water at a rate of 100 ml/minute for 5 minutes.

TABLE I

Tetrapolyimides of ODPA/PMDA/PPD/ODA Prepared by Chemical Conversion Process

| Ex. # | Monomers (mole %) | | | | DMAC (ml) | Finishing Solution (ml) | Poise | Inherent Viscosity (DMAC) (0.5%, 30° C.) |
|---|---|---|---|---|---|---|---|---|
| | ODPA | PMDA | PPD | ODA | | | | |
| Control | 100 | 0 | 0 | 100 | 131 | 0.0 | 399 | 1.35 |
| 1 | 40 | 60 | 70 | 30 | 164 | 13.6 | 4045 | 1.72 |
| 2 | 60 | 40 | 70 | 30 | 173 | 14.6 | 3789 | 1.73 |
| 3 | 70 | 30 | 70 | 30 | 209 | 12.0 | 3072 | 2.04 |
| 4 | 70 | 30 | 30 | 70 | 228 | 12.0 | 3000 | 1.75 |
| 5 | 30 | 70 | 70 | 30 | 189 | 12.0 | 3891 | 1.69 |
| 6 | 30 | 70 | 30 | 70 | 209 | 12.0 | 2458 | 1.57 |
| 7 | 50 | 50 | 50 | 50 | 209 | 12.0 | 1843 | 1.56 |
| 8 | 40 | 60 | 80 | 20 | 189 | 12.0 | 3379 | 1.71 |
| 9 | 40 | 60 | 60 | 40 | 199 | 12.0 | 1741 | 1.58 |
| 10 | 20 | 80 | 80 | 20 | 180 | 12.0 | 2867 | 1.75 |
| 11 | 20 | 80 | 60 | 40 | 189 | 12.0 | 3584 | 1.73 |

| Ex. No. | Water Absorption (%) | CTE (ppm/°C.) | CHE (ppm/% RH) | Modulus (Kpsi) | Etch Rate* (mils/min/side) | |
|---|---|---|---|---|---|---|
| | | | | | Chemical | Thermal |
| Control | 2.58 | 63.6 | — | 329 | +.002 | +.001 |
| 1 | 2.96 | 20.5 | — | 682 | .051 | — |
| 2 | 2.44 | 27.2 | — | 680 | .026 | — |
| 3 | 1.87 | 27.3 | — | 598 | .035 | +.001 |
| 4 | 1.81 | 45.0 | — | 459 | +.007 | +.002 |
| 5 | 3.10 | 17.2 | 17.6 | 605 | .036 | +.008 |
| 6 | 2.26 | 25.1 | 13.7 | 507 | +.007 | +.006 |
| 7 | 2.05 | 35.0 | — | 421 | +.006 | +.002 |
| 8 | 2.75 | 14.9 | 18.7 | 637 | .025 | +.001 |
| 9 | 2.40 | 18.1 | 30.2 | 615 | .013 | +.002 |
| 10 | 3.70 | 8.4 | — | 748 | .061 | .037 |
| 11 | 3.02 | 20.7 | — | 546 | .054 | .008 |

*Mils/min/side at 40° C. for 20 min using an etching solution of 2NKOH in 80:20/ethanol:water. Higher temperatures excursions (beyond 400° C.) caused crosslinking of some of the chemically converted films and caused swelling (positive values) rather then etching of the film.

The results given in Table I show that the caustic etchability of the tetrapolyimides prepared by chemical conversion generally increases with increasing PPD content and decreasing ODPA content. Moreover, chemically converted tetrapolyimide films were much more susceptible to caustic etching than were thermally converted tetrapolyimide films which were exposed to the same thermal curing conditions making them suitable for use in FPC and TAB applications.

EXAMPLES 12 to 13

These two examples compare a tetrapolyimide film composition prepared by a chemical conversion process (Example 12) with the same composition prepared by a thermal conversion process (Example 13).

The tetrapolyamic acid solutions in DMAC were prepared in the same manner as described in Examples 1 to 11 using the ratio of monomers shown in Table II.

The thermally converted film (Example 13) was prepared by casting a sample of the tetrapolyamic acid solution on a glass plate and drying the film at 70° C. The film was then pinned on a frame and heated for one hour at 300° C. under nitrogen in a vacuum and subsequently heated at 400° C. for 5 minutes.

The chemically converted film (Example 12) was prepared by casting a sample of the tetrapolyamic acid solution on a glass plate and immersing the cast film in a 50:50 (by volume) mixture of acetic anhydride and beta-picoline for about 5 minutes to allow the gel film to form and release from the plate. The gel film was pinned on a frame and heated at 300° C. for 1 hour and then at 400° C. for 5 minutes.

The results given in Table II show that the tetrapolyimide film prepared by chemical conversion (Example 12) had a lower water absorption, a lower coefficient of hygroscopic expansion, higher modulus and was caustic etchable when compared to the identical tetrapolyimide film prepared by thermal conversion (Example 13). These enhanced properties together with a low thermal expansion coefficient make the tetrapolyimide film ideally suited for flexible printed circuit and tape automated bonding applications.

mole % of pyromellitic acid dianhydride, 50 to 80 mole % of p-phenylene diamine and 20 to 50 mole % of 4,4'-diaminodiphenylether.

4. The tetrapolyimide film of claim 3 comprising 60 mole % of oxydiphthalic dianhydride, 40 mole % of pyromellitic acid dianhydride, 70 mole % of p-phenylene diamine and 30 mole % of 4,4'-diaminodiphenyl ether.

5. A chemical conversion process for preparing a tetrapolyimide film comprising the steps of:
  (a) reacting substantially equimolar amounts, based on the total molar amounts of dianhydride and diamine, of oxydiphthalic dianhydride, pyromellitic acid dianhydride, a phenylene diamine, and a diaminodiphenylether in an inert organic solvent for a sufficient time and at a temperature below 175° C., sufficient to form a tetrapolyamide acid solution in said solvent;
  (b) mixing said tetrapolyamide acid solution with conversion chemicals capable of converting the tetrapolyamide acid to tetrapolyimide;
  (c) casting or extruding the mixture from step (b) onto a smooth surface to form a tetrapolyamide acid-tetrapolyimide gel film; or alternatively in place of steps (b) and (c), a single step of casting or extruding said tetrapolyamide acid solution into a mixture or solution of conversion chemicals capable of converting the tetrapolyamide acid to a tetrapolyamide acid tetrapolyimide gel film; and
  (d) heating said gel film from step (c) at a temperature and for a time sufficient to convert said tetrapolyamide acid to tetrapolyimide, wherein said tetrapolyimide film has an elastic modulus of 400 to

TABLE II

Comparison of ODPA/PMDA/PPD/ODA Tetrapolyimide Film Prepared by Chemical Conversion vs. Thermal Conversion

| Ex. No. | Monomers (mole %) | | | | Water Absorption (%) | CTE** MD/TD (PPM/°C.) | CHE** MD/TD (ppm/% RH) | Modulus++ MD/TD (Kpsi) | Etch Rate* (mils/hour/side) |
|---|---|---|---|---|---|---|---|---|---|
| | ODPA | PMDA | PPD | ODA | | | | | |
| 12 | 40 | 60 | 70 | 30 | 2.85 | 20.5/16.1 | 22/19 | 552/559 | 1.58 |
| 13 | 40 | 60 | 70 | 30 | 3.64 | 46.9/47.6 | 54.1/50.5 | 424/435 | +0.02 |

*Mils/hour/side at 40° C. for 20 minutes using an etching solution of 2NKOH in 80:20/ethanol:water. Positive values indicate some swelling of the film with no appreciable etching.
**Measured in machine direction/transverse direction of the film.

What is claimed is:

1. A chemically converted tetrapolyimide film for dielectric use in flexible printed circuits and tape automated bonding applications comprising, based on the total molar amount of dianhydride, from 20 to 70 mole % of oxydiphthalic dianhydride and from 30 to 80 mole % of pyromellitic acid dianhydride and, based on the total molar amount of diamine, from 30 to 80 mole % of a phenylene diamine and from 20 to 70 mole % of a diaminodiphenylether, wherein said tetrapolyimide film has an elastic modulus of 400 to 1,000 Kpsi, a coefficient of thermal expansion of 8 to 35 ppm/° C., a coefficient of hygroscopic expansion of 10 to 30 ppm/% RH, a water absorption of less than 4% and an etch rate greater than the same tetrapolyimide film prepared by a thermal conversion process using the same time and temperature conditions.

2. The tetrapolyimide film of claim 1 wherein the phenylene diamine is p-phenylene diamine and the diaminodiphenyl ether is 4,4'-diaminodiphenyl ether.

3. The tetrapolyimide film of claim 2 comprising from 30 to 70 mole % of oxydiphthalic dianhydride, 30 to 70

1,000 Kpsi, a coefficient of thermal expansion of 8 to 35 ppm/° C., a coefficient of hygroscopic expansion of 10 to 30 ppm/% RH, a water absorption of less than 4% and an etch rate greater than the same tetrapolyimide film prepared by a thermal conversion process using the same time and temperature conditions.

6. The process of claim 5 wherein the phenylene diamine is p-phenylene diamine and the diaminodiphenyl ether is 4,4'-diaminodiphenyl ether.

7. The process of claim 6 wherein the tetrapolyimide film comprises on the basis of dianhydride from 20 to 70 mole % of oxydiphthalic dianhydride and from 30 to 80 mole % of pyromellitic acid dianhydride and on the basis of diamine from 30 to 80 mole % of p-phenylene diamine and from 20 to 70 mole % of 4,4'-diaminodiphenyl ether.

8. The process of claim 7 wherein the tetrapolyimide film comprises from 30 to 70 mole % of oxydiphthalic dianhydride, 30 to 70 mole % of pyromellitic acid dianhydride, 50 to 80 mole % of p-phenylene diamine and 20 to 50 mole % of 4,4'-diaminodiphenyl ether.

9. The process of claim 8 wherein the tetrapolyimide film comprises 60 mole % of oxydiphthalic dianhydride, 40 mole % of pyromellitic acid dianhydride, 70 mole % of p-phenylene diamine and 30 mole % of 4,4'-diaminodiphenyl ether.

10. The process of claim 5 wherein the conversion chemicals comprise tertiary amine catalysts and anhydride dehydrating agents.

11. The process of claim 10 wherein the tertiary amine is beta-picoline and the dehydrating agent is acetic anhydride.

12. The process of claim 5 wherein the inert organic solvent is selected from the group consisting of N-methyl-2-pyrrolidone, dimethylsulfoxide, N,N-dimethylacetamide, N,N-diethylformamide, N,N-diethylacetamide, N,N-diethylformamide and mixtures thereof.

* * * * *